United States Patent [19]
Williams

[11] Patent Number: 5,513,132
[45] Date of Patent: Apr. 30, 1996

[54] ZERO LATENCY OVERHEAD SELF-TIMED ITERATIVE LOGIC STRUCTURE AND METHOD

[75] Inventor: Ted E. Williams, Santa Clara County, Calif.

[73] Assignee: Hal Computer Systems, Inc., Campbell, Calif.

[21] Appl. No.: 42,459

[22] Filed: Apr. 5, 1993

Related U.S. Application Data

[63] Continuation of Ser. No. 782,844, Oct. 24, 1991, abandoned, which is a continuation of Ser. No. 595,350, Oct. 10, 1990, Pat. No. 5,121,003.

[51] Int. Cl.⁶ .................................. G06F 7/00; G06F 7/52
[52] U.S. Cl. ................................... 364/715.01; 364/761
[58] Field of Search .......................... 364/715.01, 716, 364/761, 703; 331/57; 365/203, 189.04, 222; 307/445, 443, 452, 272.2, 279, 480

[56] References Cited

U.S. PATENT DOCUMENTS

4,710,650  12/1987  Shoji ............................. 307/452
4,758,990  7/1988  Uchida .......................... 365/203 X
5,023,827  6/1991  Kehl et al. ...................... 364/761 X Primary Examiner—Tan V. Mai
Attorney, Agent, or Firm—Flehr, Hohbach, Test, Albritton & Herbert

[57] ABSTRACT

A novel third phase of CMOS domino logic is identified and used in the logic system of the present invention to store data. The use of this third phase in addition to the normally used precharge and logic evaluation phases, provides a logic structure of cascaded domino logic gates which are pipelined without intervening latches for memory storage. The memory storage function of the conventional latches being provided by the third logic phase. The novel approach requires that the functional inputs to this system have strictly monotonic transitions during the logic evaluation phase, and requires that the precharge signal must be active during only the precharge phase. Embodiments of the pipelined system according to the invention, are structured so that the output of the pipeline are fed back to the input of the pipeline to form an iterative structure. Such a feedback pipeline is viewed as a "loop" or "ring" of logic. The logic ring circulates data until the entire computation is complete. A method for using the logic structure is also described.

52 Claims, 9 Drawing Sheets

ZERO LATENCY OVERHEAD SELF-TIMED ITERATIVE LOGIC STRUCTURE AND METHOD

This is a continuation of application Ser. No. 07/782,844 filed Oct. 24, 1991, now abandoned. Which is a continuation of application Ser. No. 07/595,350 filed Oct. 10, 1990 now U.S. Pat. No. 5,121,003.

FIELD OF THE INVENTION

This invention relates to digital electronic circuits., and, more particularly, to self-timed circuits, including iterative division algorithms. The design technique of the present patent is called "Zero-overhead Self-timed Iterative Logic," abbreviated ZOSTIL.

BACKGROUND OF THE INVENTION

The timing performance of any system can be judged by one of two measures: latency or throughput. The delay from an input to the resulting output is called the latency, and most real world problems desire this delay to be minimized. If a system can have several computations in progress at once, then the minimum delay between two successive inputs determines the throughput, which is the maximum data rate at which the system can accept requests for computation. Performance assessed by either of these measures depends on the sum of the raw propagation delay through the combinational logic of the desired function plus "other" overhead delays. From a theoretical point of view, the fastest circuit would eliminate all overheads and have circuit delays due to only the raw combinational logic. The innovations in this patent reduce the latency overhead in a pipeline to zero. Hence, the ZOSTIL innovation will produce functions whose latency attains the theoretical lower bound, but without requiring the large and costly area of a full combinational array.

Traditional synchronous circuit design techniques separate combinational logic from data storage. That is, storage is provided by explicit latches interposed between sections of combinational logic. This design technique has at least four sources of overhead which increase circuit latency: 1) propagation delay through latches; 2) margin added to tolerate clock skew; 3) wasted time in fast stages within the system; 4) maximizing data-dependent delay; and 5) the assumption of worst case timing of components.

The first source of latency overhead is due to latches because they introduce additional delays due to their set-up time and propagation delays. The minimum cycle time of a synchronous circuit is the sum of the latch set-up time, latch propagation delay, and maximum combinational logic delay. The first innovation in the ZOSTIL methodology is remove this overhead completely by removing the explicit latches altogether and making use of the "free" half-latch at the output of each stage in a CMOS domino chain.

The second source of latency overhead comes from needing to distribute the clock to all latches in the system. Communicating stages must be in agreement as to when the clock edges occur, but wire or driver delays cause clock skew which must be compensated for by adding some margin to the total clock period. This added margin is also overhead. Previous asynchronous design techniques used handshaking blocks to remove global clocks and the extra latency overhead due to clock skew by communicating data validity locally instead of globally. But these previous techniques include explicit latches, and hence, still had the latency overhead due to latch propagation delays. Previous techniques also added some overhead due to the forward directed paths within the handshaking logic. The second ZOSTIL innovation is to insure all control paths operate in parallel with the forward evaluation rather than adding sequentially to the path.

The third source of latency overhead is due to mismatching of the functional sections between the latches. Because the amount of time in a clock period is fixed, it must be set equal to the longest propagation delay of all of the different functional sections in the system. The difference between that maximum and the actual time used by any functional section is overhead because it is wasted time. A self-timed dataflow does not waste this time because it allows data to flow forward based on data-driven local control, rather than waiting for clock edges. Although the throughput of a pipeline is still limited by its slowest stage, the latency is improved by letting each stage progress as soon as it can.

The fourth source of latency overhead comes from determining critical paths in synchronous logic based on the worst-ease data values. If there is a large variance then there is a large performance loss due to the difference between the average and maximum values of delay. Synchronous designers try to adjust transistor sizing to equalize the various paths through a body of logic, but in self-timed systems it is desired to minimize the probabilistic expected value of the delay rather than minimizing the maximum delay. The third innovation of this patent is to make use of any known probabilistic distribution of the inputs of each block of logic in order to size the transistors in that block to minimize the expected value of the total delay.

The fifth source of latency overhead is the derating used to insure performance over a range of temperature and voltage levels. Synchronous system design must always be based on conservative derated "worst-case" specifications because the system must work at the environmental extremes. But when the actual conditions are not at the extremes, the difference between the possible performance and the actual designed performance is wasted performance. Serf-timed components will always run at their maximum speed for the existing conditions and deliver their outputs as soon as they are actually Finished. By providing completion indication, they allow an enclosing system to make use of the output sooner than always waiting for the worst case.

Background and Nomenclature for Dual-Monotonic Signals

If A is a dual-monotonic signal, it is be represented by two "sub-signals", called $A^0$ and $A^1$, with the encoding: if both of the wires are in the same logical state, say low, then the signal A has not yet evaluated; if either $A^0$ or $A^1$ changes state, this communicates the signal A has finished evaluating, and the state of A is determined by .noting which of the two wires changed. For Example, if both $A^0$ and $A^1$ have the binary value '0', then the value of the signal, A, is not yet determined. If $A^1$ transitions to '1', then the value of A is '1', while if $A^0$ transitions to '1', then the value of A is '0'. The pair of wires is called a dual-monotonic pair because the transitions on the wires must be monotonic during evaluation. These transitions are mutually exclusive, and either one indicates the evaluation of is complete and can be used by other circuits. In this patent, signal names are italicized, and a "*" is used to indicate logical inversion. Also, each half of a dual-monotonic signal will have a superscript of 1 or 0.

Background on Domino Logic

Figure 1:
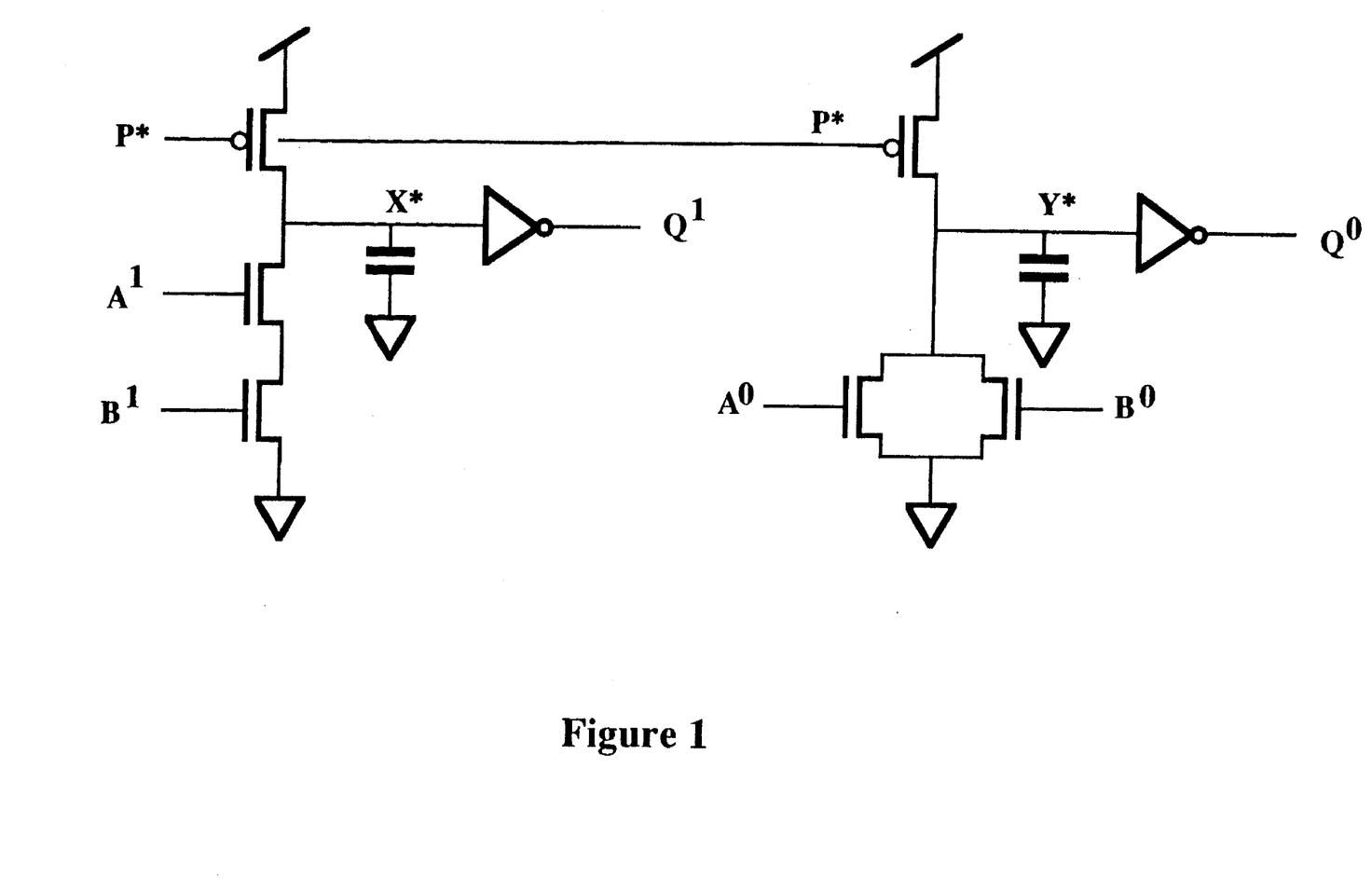

Monotonic signals can be conveniently generated by CMOS domino logic. Each signal can be in one of three functional phases: 1) precharge or reset, 2) logic evaluation, or 3) data storage. These three phases are shown in FIG. 1 which shows, respectively, a two-input dual-monotonic AND gate and its waveform diagram. During the reset phase, the active low precharge signal, P*, is active and the A and B signals must be inactive. This causes the precharged nodes X* and Y* to be high, and the Q outputs, to be low. In the logic evaluation phase, either $A^0$ or $A^1$ and either $B^0$ or $B^1$ will transition high monotonically. If both $A^1$ and $B^1$ transition high, the AND gate's $Q^1$ output monotonically transitions high, and if either $A^0$ and $B^0$ go active, the $Q^0$ output will go high. Outing the data storage phase, both A and B signals are forced low, and P* remains inactive. This condition leaves the precharged nodes X* and Y* undriven, and capacitance causes them to act as a memory elements so the outputs, $Q^1$ and $Q^0$, remain in the same state as they were during the logic evaluation phase. Thus, each domino stage includes a "free" half-latch because no additional transistors and no additional logic delays are needed to store data.

Overview of the Innovations

CMOS domino logic is normally used only in two phases: precharge and logic evaluation. The invention of the present patent uses a third phase to store data, which allows domino logic gates to be cascaded and pipelined without intervening latches. The inputs to this system must have strictly monotonic transitions during the logic evaluation phase and the precharge signal must be active during only the precharge phase. Furthermore, the pipelined system can feed its output back to the input to form an iterative structure. Such a feedback pipeline is viewed as a "loop" or "ring" of logic which circulates data until the entire computation is complete.

The innovation of making use of the temporary storage of a precharged function block allows the explicit latches to be omitted. Each domino stage provides the operation of a half-latch for free. The Reset Control logic operates completely in parallel with the function block evaluation. Completion detection logic in each Reset Control block observes the output of the following Function Block to determine when all of its outputs have finished evaluating and then instructs its own Function Block to move from the data storage phase to the precharge phase, driving all its outputs to the reset state. When the outputs of the following Function Block subsequently become reset, the Reset Control turns off the precharge signal for its Function Block, causing it to be ready for the data evaluation phase when its next data input actually arrives.

By encoding the data in dual-monotonic pairs, there is no forward handshake required and thus the control logic is removed from the critical path of the circuit. This innovative methodology, in conjunction with the first innovation removing the need for explicit latches, yields a truly zero overhead minimum latency delay path through pipelined logic.

The ZOSTIL technique includes combining the latch-free circuits and parallel Reset Control into an iterative structure, or "ring." This is particularly important for arithmetic operations which perform the same basic function over and over. Example of these type of functions are: multiplication, division, square root, sine, and cosine.

ZOSTIL circuits are robust because, with proper design of the control logic, they are delay-independent. That is, the circuits will function correctly regardless of the actual delays of the circuit elements. Therefore, calculations involving delays are not necessary to insure the logical correctness or functionality of the system, but are used only to estimate the performance. This contrasts to synchronous design techniques which require extensive delay calculations to insure all computations within a single logic stage can be performed in one clock cycle. Improper delay estimation may result in a synchronous circuit which does not always produce the correct result.

Division algorithms generate a quotient by successive determination of quotient digits from most significant to least significant. Because each quotient digit is used in the computation of the next partial remainder, which in turn is required to determine the next quotient digit, division is an inherently sequential process. Hence, a pipelined ting designed with the ZOSTIL technique is ideal for performing arithmetic division. An additional innovation specific to division is to overlap and interlock stages to allow two remainder computations to occur in parallel. This is accomplished by modifying an algorithm, known as SRT division, to perform several small remainder computations in parallel and choose the correct remainder when the quotient digit from the previous stage is determined. This innovation improves the overall latency by a factor of two in comparison with the previous algorithms.

BRIEF DESCRIPTION OF THE DRAWINGS

The present invention will be better understood by reviewing this description given with reference to the following drawings:

FIG. 1: Self-Timed Domino Logic AND Gate

This is a schematic of a two-input dual-monotonic self-timed AND gate constructed in CMOS technology.

FIG. 2: Precharged Function Blocks

This is a linear pipeline of precharged function blocks which also includes logic for completion detection, which is used to reset the function blocks.

FIG. 3: Datapaths Merging

This is a schematic showing the Control Reset Logic needed to merge two self-timed pipelines.

FIG. 4: Datapaths Splitting

This is a schematic showing the Control Reset Logic needed to split a self-timed pipeline.

FIG. 5: Improving Expected Total Delay

This shows how changing the circuit topology without changing the function can improve the expected circuit performance.

FIG. 6: Logic for Four Stage Self-Timed Ring

This is a four stage pipeline ring of precharged function blocks.

FIG. 7: Dependency Graph for Four Stage Self-Timed Ring

This is dependency graph of the schematic shown in FIG. 7.

FIG. 8: Sequential Data-flow in Ordinary Radix 2 SRT Division

This is schematic showing the dataflow in one stage of previously described SRT division algorithm.

FIG. 9: Intra-stage Overlapped Execution of Radix 2 SRT Division

This is a schematic showing the improvement in SRT division.

DETAILED DESCRIPTION OF THE INNOVATIONS

This patent develops innovations in asynchronous circuit design technique leading to "Zero-overhead Self-timed Iterative Logic," abbreviated ZOSTIL.

The ZOSTIL Technique

Asynchronous circuits have the potential for avoiding the latency overheads of synchronous circuits. By communicating completion status along with the data, each processing element can begin to operate on data as soon as it arrives without waiting for re-synchronization to a global clock at every latch.

Previous implementations of asynchronous logic used explicit latches to store intermediate results. These latches introduce additional propagation delay to the circuit's critical path, but do not directly contribute to the computational function. The first innovation of this patent is to avoid explicit latches entirely by using CMOS domino function blocks as "free" half-latches. This is possible only if the control for the function block precharge makes certain the outputs from a function block have been utilized by all subsequent stages before resetting a function block and destroying the data. In order to determine when succeeding function blocks are finished using the data, it is necessary to construct a completion detector.

A simple OR gate connected to the two wires of each dual-monotonic pair output provides a done indicator for each individual signal output from a logic stage. The stage is considered done computing when all of its data outputs are individually done. A tree of last-of gates, commonly called C-elements, can be used as the completion detector to determine when all of the bits in a datapath have changed. Each C-element has the property that its output is that of the inputs when they were last the same. The output of a tree of C-elements will indicate done when all of the inputs are done and the output will indicate reset when all of the inputs have reset.

Figure 2:
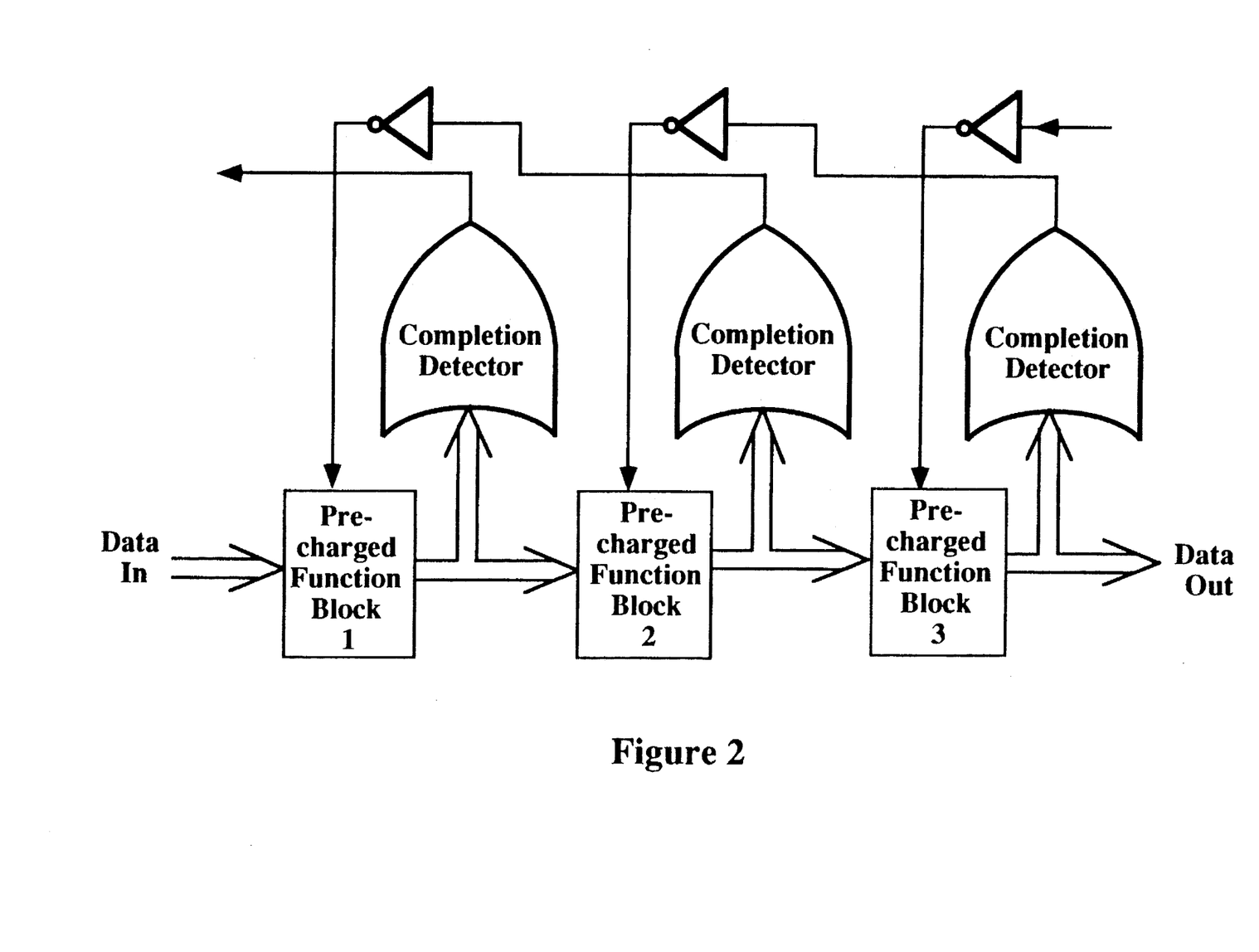
Figure 3:
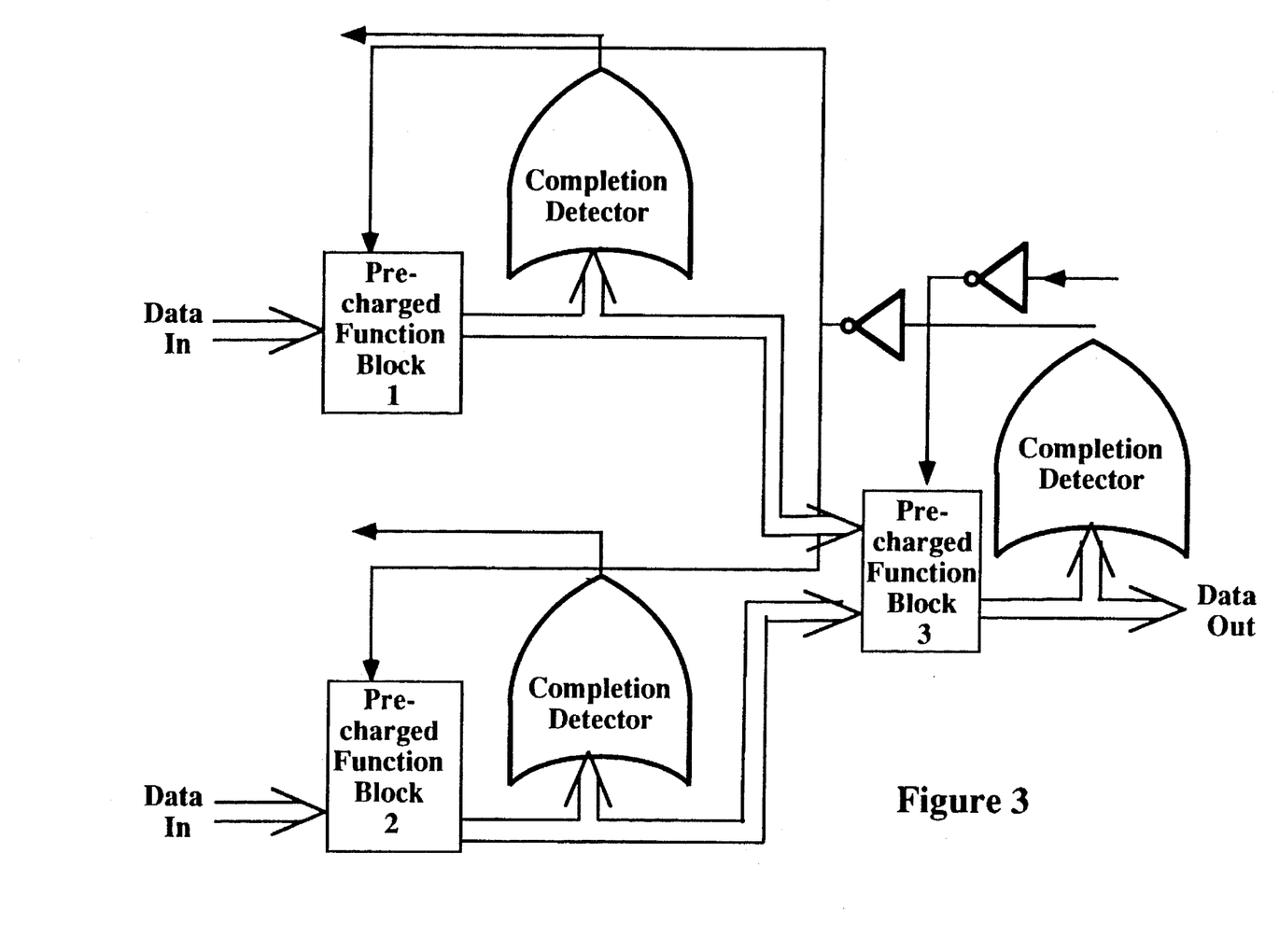
Figure 4:
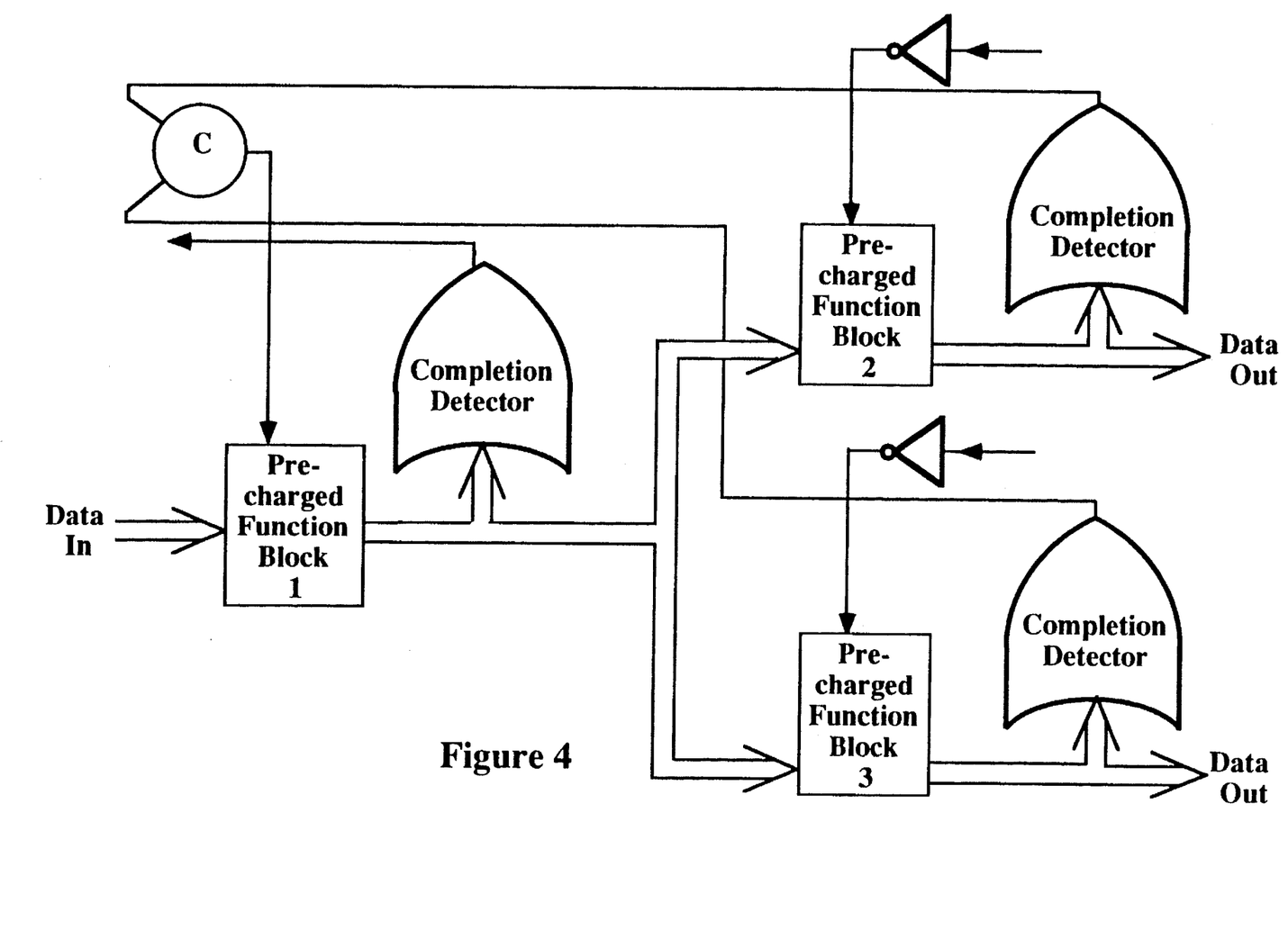
Figure 5:
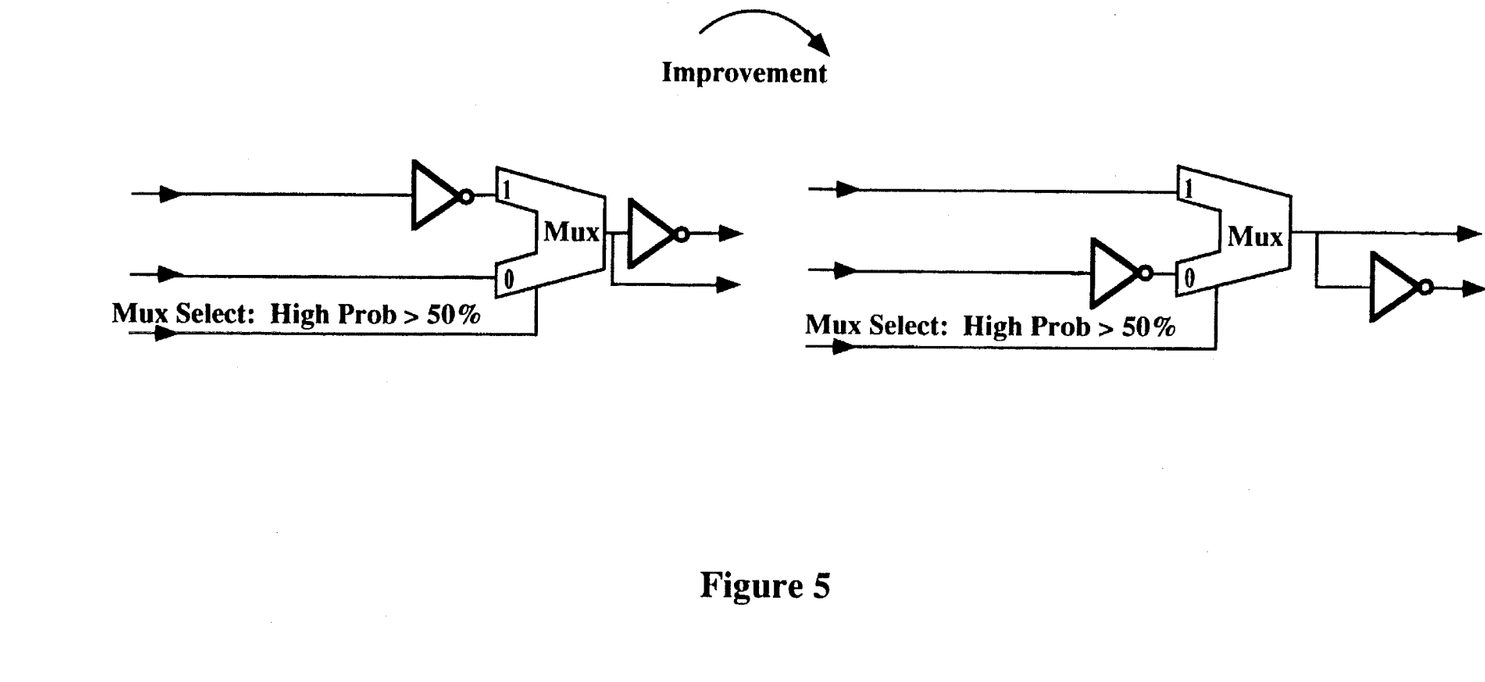

Once the completion signals are generated, they must be used to provide the control for resetting the precharged blocks appropriately. Previous self-timed circuits required both forward and backward handshakes, but the second innovation of this patent is to completely embed the completion indication of the forward data in dual-monotonic pairs and to eliminate the forward handshake. Further, the backward handshake can be designed so that it does not affect the forward critical path. For a simple unidirectional data flow, this control is a sequence of backward pointing inverters as shown in FIG. 2. For merging and splitting datapaths, the control is as shown in FIGS. 3 and 4. None of these control circuits are in the direct path of the forward flowing data and hence they do not add to the latency of the forward flowing wave of data.

The control logic resets each function block before the next wave of data comes along and causes the function block to evaluate its outputs again. As long as the data waves are spaced apart, each data wave will propagate with latency equal only to the pure combinational delay, without any additional overhead.

If a problem requires repetitive execution of a logical function, then it is particularly appropriate to build a ring of precharged function blocks. The function blocks can be the same, or they may implement different functions. The width of the datapath between stages of the ring need not be constant. The data in a self-timed ring loops around the ring at the same speed as it could progress through a large combinational array, but the silicon area of the circuit is much reduced. A physical analogy to this is a circle of dominoes. The trick is to make the wave of falling dominoes progress around the circle continuously at the same speed as it would down a long row of dominoes, and this is accomplished by standing each domino back up after its successor has fallen.

Usually a linear pipeline is judged by the throughput of the stages. But when the stages are connected into a ring to solve a single iterative problem, the time it takes to compute the answer is dependent on the latency through the stages. So having low latency is the important property for the stages in a loop rather than throughput. Zero overhead control logic reduces the latency to the lower bound of strictly the combinational delay of the function blocks.

Dependency graphs verifying Zero Overhead

The ZOSTIL technique results in circuits which function correctly independent of the actual delays taken by each of the blocks. The designs are thus robust since changes in the delays will not affect the logical operation of the circuit. But, the actual delays determine the overall performance, and relative delays determine which path through the circuit is the limiting, or critical, path. The objective of "Zero-overhead" design is to make sure that the performance is limited only by the function blocks comprising the desired combinational logic, and hence that the critical path under nominal relative delays does not go through any control blocks. If the performance analysis shows the circuit does not achieve zero overhead, then the schematic can be modified by making the stages more finely grained until zero overhead latency is achieved.

Figure 6:
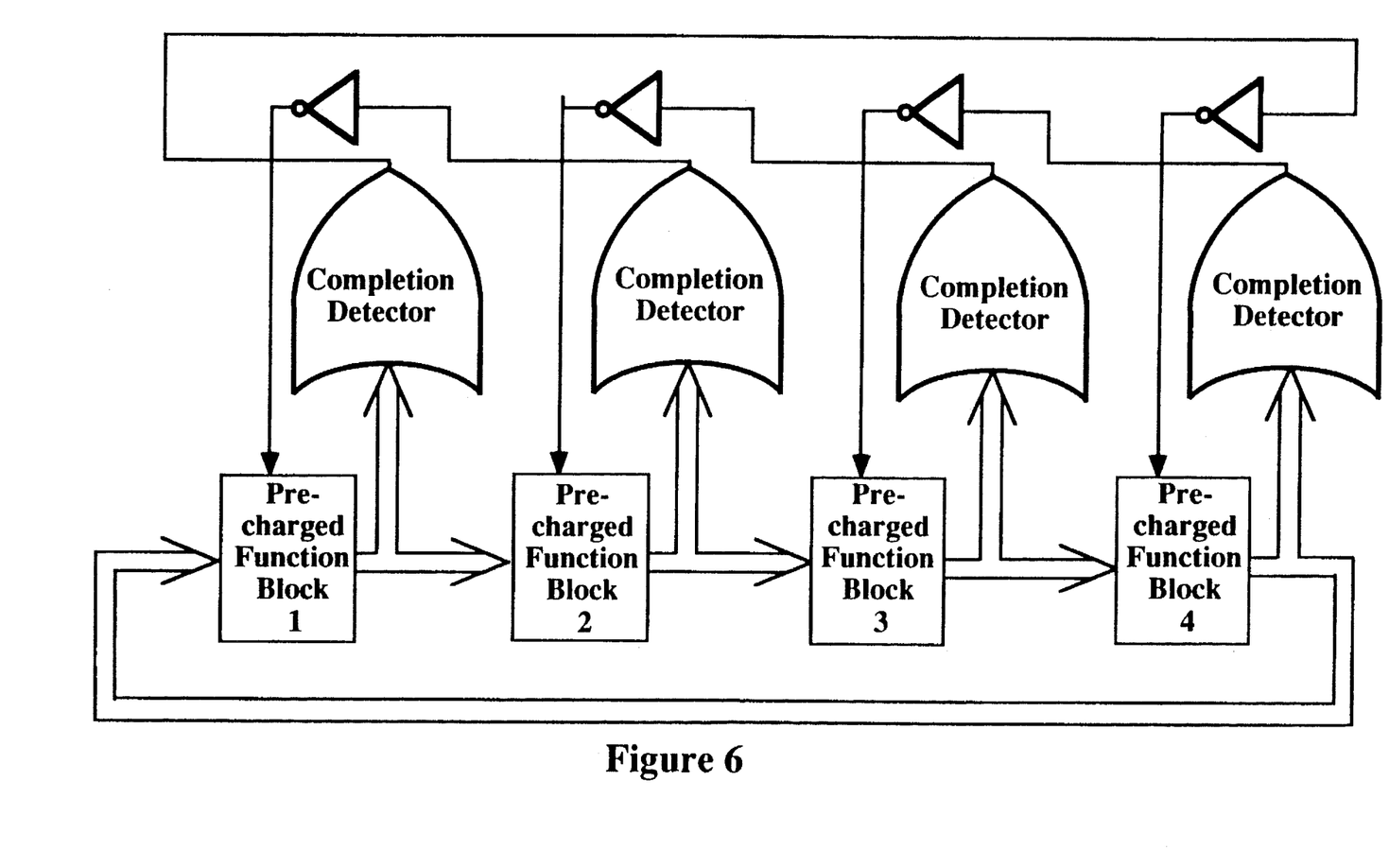
Figure 7:
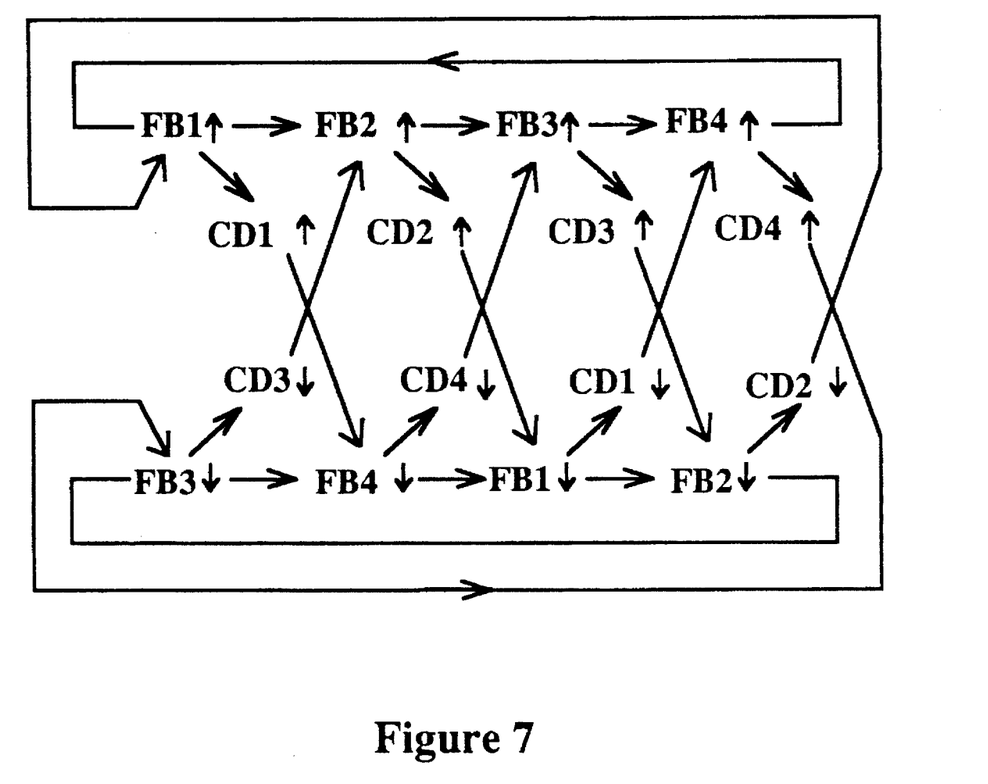

To insure a design has no overhead due to control, dependency graphs are drarn to illustrate all possible critical paths. A simple ring and its dependency graph are shown in FIG. 6 and 7. The critical cycle time of data flowing around the ring will be the longest cyclic path in the graph. The graph is really a restricted Petri-net and the firing rules are the same; a node is marked when all of its predecessors have been marked.

Adjusting Logic and Transistor Sizing Based on Data Probabilities

Since self-timed circuits accompany data with completion signals, subsequent computations may begin as soon as each data arrives. Since it is not required that processing times are the same, what is really desired is that the total expected value of delay is minimized. In cases where data values are distributed with equal probability, the expected value is, of course, minimized when the average delay is minimized. However, in some cases, the designer may know that data values will have a particular distribution, and this information can be used to minimize the total expected value to be better than just the average of all data value delays.

Paths that are known to have higher than average usage can be made faster by shortening the number of logic blocks they contain or by widening the transistors so that the blocks go faster. For example in FIG. 6, a net improvement in the expected value of delay will result if, by inverting both arms of a multiplexor, an inverter is removed from the arm known to be more frequently chosen, even though this results in an inverter being added to the other arm. Likewise, if some output of a block must be loaded with transistors beginning two different paths, narrowing the transistors in the infrequently chosen path will slow that path, but will result in an overall improvement in expected delay because the output node which was also pan of the frequently chosen path will be faster due to less loading.

Self-Timed SRT Division

Performing division requires making a choice of quotient digits starting with the most significant, and progressing to the least significant, digits. The quotient digit decision is made as a part of each iteration which recomputes the next partial remainder based on the previous partial remainder and quotient digit. Between each iteration, the partial remainder is shifted left by the base, or radix r, of the digits being used. Each iteration thus implements $$R_{i+1} = rR_i - Dq_i$$

where $R_i$ is the partial remainder output from stage i, r is the radix, $q_i$ is the quotient digit determined from stage, D is the Divisor, and the sequence is initialized with $rR_i$—the Dividend.

In ordinary division, the quotient digits $q_i$ are in the set {0, . . . , r–1}, and the full quotient has only a single valid representation since each digit position in the quotient has only a single correct representation. Unfortunately, determining the correct digit at each position requires comparison of the exact partial remainder, and this means the entire partial remainder must be computed before determining each quotient digit. This computation requires a complete carry-propagate subtract to generate the partial remainder before each quotient digit may be selected.

One published algorithm for division is know as the SRT algorithm. The key idea of SRT division is to avoid a complete carry propagation in each iteration by making the set of valid quotient digits redundant by including both positive and negative integers in the set $\{-p, \ldots, 0, \ldots, p\}$. The range of quotient digits must have $\frac{r}{2} \leq p \leq r-1$. With redundant quotient digit sets, the final quotient result can be represented in several different ways, giving a choice of quotient digits for each position. Any valid representation can always, of course, be convened to the desired irredundant representation by subtracting the positionally weighted negative quotient digits from the positionally weighted positive digits. This subtraction requires a carry propagation, but it is a single operation which needs .only to be performed once for the whole division operation rather than once per stage. Further, in an integrated floating-point chip, this full-length carry-propagate operation could be performed by shipping the quotient results to a separate part of the chip implementing fast carry-look-ahead addition.

Since, in SRT division, the quotient set contains digits of both signs, the quotient selection logic for a given position need only use an approximation of the divisor and partial remainder. This is because small errors may be corrected at a later stage with less significant quotient digits of the opposite sign. Because only an approximation of the partial remainder is required at each stage for the selection of quotient digits, only a small number of the most significant bits of the partial remainder need to be examined.

Figure 8:
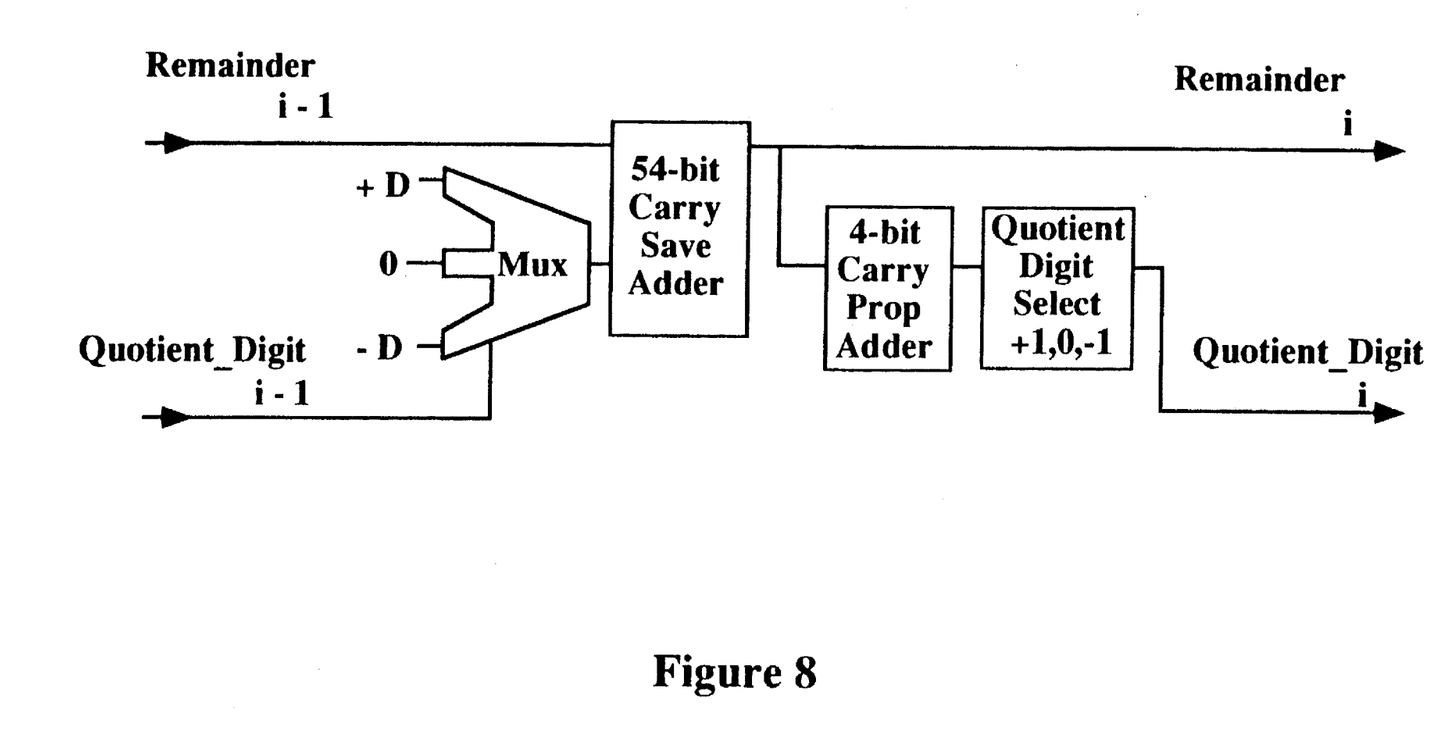

The simplest form of SRT division is to use radix r=2 with only three quotient digits: +1, 0, −1. This requires looking at only the top four bits of remainder at each stage in order to make the correct quotient digit selection. The ordinary sequential data-flow for each stage of this algorithm is shown in FIG. 8. In discrete implementations, higher radices such as r=4 and r=16 have routinely been used.

The probabilistic distribution of quotient digits is not uniform due to the numerical properties of SRT division. In the radix 2 case, the three quotient digits have probabilities of 42%, 35%, and 23%; and 4% of the time it is even possible to predict two quotient digits in advance. The sign bit of the internal partial remainders has a 77% probability of being on, even for uniformly distributed input operands. These statistics are used to speed the more frequently used circuit paths since the self-timed implementation which can take advantage of the improvement.

Intra-stage Overlapped Execution Innovation

Figure 9:
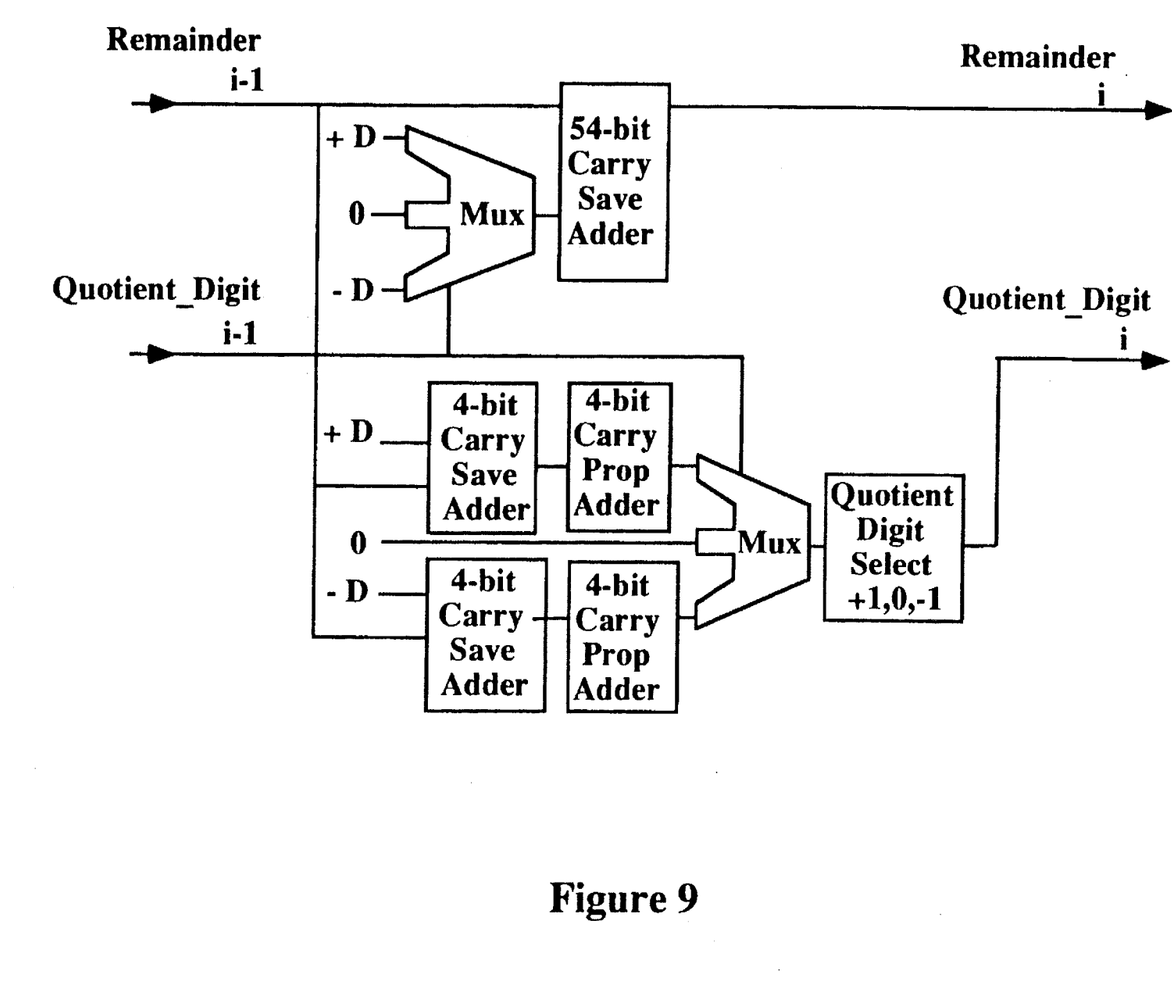

Prior to this innovation, the steps of the SRT division algorithm have been regarded as being purely sequential. In this patent, the steps within each stage of the algorithm are overlapped which makes it faster by allowing additional parallelism. The data flow for this innovation is shown in FIG. 9. Specifically, the partial 4-bit carry-save and carry-propagate adders for the remainder formation in each stage can operate in parallel with the previous quotient digit selection and the stage's own divisor multiple multiplexor and 54-bit carry-save adder. One of the inputs to the partial adders used to be the chosen divisor multiple from the previous stage, which required knowing the selected quotient digit. But if the partial adders operate in parallel, then the quotient digit is not yet determined. Instead, the innovation is to duplicate the partial adders for each of the possible quotient digits, allowing them to begin computation earlier and in parallel, and then choose between their results when the quotient digit from the previous stage catches up. Since there are three possible quotient digits, there needs to be a path for each possibility. Fortunately, since one of the quotient digits is zero, there need be only two partial carry-save adders. This innovation trims the average propagation delay per stage by approximately one-half because the delay is dominated by the carry-propagate adder, and the intra-stage overlapped execution allows the carry-propagate additions in two successive stages to be executing simultaneously.

The innovation of intra-stage overlapped execution of SRT division can be combined with the ZOSTIL innovation by self-timing a sequence of stages, each having data flow of FIG. 9. This requires using the merge and join constructs presented in FIG. 3 and 4. A loop of four of these stages will repetitively operate as fast as if the logic for the stages were assembled into a prohibitively large combinational array.

What is claimed is:

1. A method for use with an apparatus, said apparatus including a plurality of function blocks, said plurality of function blocks being arranged in preceding and trailing orders, said method comprising the steps of:

evaluating at least one functional input signal by a function block during an evaluation phase;

sustaining and providing evaluated input signal during a storage phase;

detecting completion of output signal generation by said function block; and resetting respective trailing function block in response to detection of said completion of output signal generation during a reset phase.

2. The method of claim 1, further comprising the step of:

generating a final output signal in response to each of said plurality of functional outputs generated by said plurality of function blocks.

3. The method of claim 2, further comprising the step of generating a final completion signal in response to said final output signal.

4. The method of claim 1, wherein each of said function blocks is a domino circuit for evaluating dual-monotonic signals.

5. The method of claim 1, wherein each of said function blocks is a stage of a divider.

6. The method of claim 5, further comprising the steps of generating division results for a plurality of division stages, said steps including:

generating a partial remainder in response to a trailing partial remainder and a trailing quotient digit generated by a trailing division stage; and generating a quotient digit in response to said trailing partial remainder and said trailing quotient digit;

wherein said partial remainder and said quotient digit are processed in parallel.

7. The method of claim 6, wherein said quotient digit has one of three possible values.

8. The method of claim 7, wherein said first second, and third possible value of said trailing quotient digit are +1, −1, and 0 respectively.

9. The method of claim 8, wherein said remainder and said quotient digit are generated in accordance with SRT algorithm.

10. The method of claim 9, wherein said step for generating said quotient comprises the steps of:

generating a first possible value of said quotient digit in response to said trailing partial remainder and said first possible value of said trailing quotient digit;

generating a second possible value of said quotient value in response to said trailing partial remainder and said second possible value of said trailing quotient digit;

wherein said third possible value of said trailing quotient digit is a third possible value of said quotient digit; and selecting said first, second, and third possible values of said quotient digit in response to true value of said quotient digit.

11. The method claim 10, wherein said steps of generating said first and second possible value of said quotient digit comprises the steps of:

generating a part-bit carry-save arithmetic sum; and generating a part-bit carry-propagate arithmetic sum.

12. The method of claim 1, wherein each of said function blocks performs a bit of arithmetic operation for multiplication, division, square root, sine or cosine.

13. The method of claim 1, wherein said apparatus further includes a plurality detecting means with each of said detecting means being able to generate a completion signal, said method further comprising the steps of:

coupling output signals generated by trailing function blocks only to respective preceding function blocks; and coupling completion signals generated by preceding function blocks only to respective trailing function blocks.

14. The method of claim 1, further comprising the steps of:

forming a critical path by coupling output signals from said plurality of function blocks to their respective preceding function blocks;

forming a plurality of control paths by coupling completion signals from a plurality of control circuits to their respective trailing function blocks; and wherein said plurality of control paths are parallel to said critical path and none of said plurality of control paths overlap with said critical path, thereby that raw combinatorial latencies are only determined by said function blocks connected to said critical path and are not affected by said control circuits connected to said control paths.

15. The method of claim 14, further comprising the step of:

graining function blocks coupled to said control path more finely if a control path overlaps with said critical path, thereby removing such overlap out of said critical path.

16. The method of claim 1, further comprising the step of:

coupling an output of the most preceding function block, an input of the most trailing function block, and coupling the completion signal generated by said most trailing function block to a reset terminal of said most preceding function block so that connections among said plurality of function blocks form a ring structure.

17. The method of claim 1, further comprising the steps of:

merging at least two output signals generated by at least two trailing function blocks to an input of a preceding function; and splitting completion signal generated by said preceding function block so that said completion signal is coupled to reset terminals of said at least two trailing function blocks.

18. The method of claim 1, further comprising the steps of:

splitting an output signal generated by a trailing function block to at least two signal paths so that said output signal is coupled to at inputs of at least two preceding function blocks;

combining completion signals generated by control circuits upon said detection of completion of output signal generation of said at least two preceding function blocks; and coupling combined completion signals to reset terminal of said trailing function block.

19. The method of claim 1, wherein each of said function blocks includes a signal path for receiving and passing input signal, and for generating and providing output signal, wherein said plurality of said function blocks include a plurality of signal paths, said method further comprising the steps of:

identifying at least one of said signal paths that has higher usage probability; and setting wider conduct path for-devices, including transistors, located in said at signal path having higher usage probability, thereby increasing speed of said signal path.

20. The method of claim 1, wherein each of said function blocks includes a signal path for receiving and passing input signal, and for generating and providing output signal, wherein said plurality of said function blocks include a plurality of signal paths, said method further comprising the steps of:

identifying at least one of said plurality of signal paths that has higher usage probability than other of said plurality of signal paths;

simplifying logic blocks located in said signal path having higher usage probability, thereby by increasing speed of said signal path; and modifying logic blocks located in at least one of said other signal paths to generate equivalence of said output signals.

21. An apparatus for computing a logical or arithmetic result from input data, said apparatus comprising:

a plurality of function blocks for generating a functional output in response to at least one functional input, said functional input comprising at least one input signal;

each of said plurality of function blocks including a reset port for receiving a reset signal, an input port for receiving said at least one functional input, storage means for storing said functional output, and an output port for communicating said functional output;

said plurality of function blocks arranged in pair-wise-relative leading and trailing order, wherein said output port of one of said trailing function blocks is coupled directly to said input port of at least one of said leading function blocks, and wherein said input port of one of said leading function blocks is coupled directly to said output port of at least one of said trailing function blocks;

said plurality of function blocks being interconnected without interposing a separately controlled storage element between any of said function blocks; and control means coupled with each said pair-wise-relative trailing function blocks for generating said reset signal to select the operational phase of said trailing function blocks in response to characteristics of said functional output of at least one of said pair-wise-relative leading function blocks.

22. The apparatus as in claim 21, wherein said plurality of function blocks being interconnected to define at least one unbranched sequential processing path, said path including one of said plurality of function blocks that receives at least part of said input data and one of said plurality of function blocks that generates at least part of said result; and wherein said control means operating substantially in parallel with said function blocks so that the total time for said computing of said result from said input data is substantially equal to the sum of the latencies of said function blocks on said at least one sequential processing path.

23. The apparatus as in claim 22, wherein said characteristics of said functional output comprise a functional output amplitude value and a functional output timing value; and wherein said control means selects said operational phase of each said function block by generating said reset signal according to predetermined rules to configure said function blocks into one of a reset phase, an evaluation phase, and a storage phase;

said function blocks being reset during said reset phase, generating said functional output during said evaluation phase, and sustaining said functional output at said storage means and providing said functional output at said output port during said storage phase.

24. The apparatus as in claim 23, wherein each said control circuit includes detecting means for generating an evaluation completion signal upon detecting that said pair-wise-relative leading function block has generated said functional output, and wherein said detecting means has an input terminal coupled to said functional output port of said pair-wise-relative leading function block and has an output terminal coupled to said reset port of said pair-wise-relative trailing-function block.

25. The apparatus as in claim 20, wherein each of said function blocks is a domino circuit.

26. The apparatus of claim 25, wherein said domino circuit comprises:

a first output terminal within said output port;

first resetting means, coupled to said first output terminal, for resetting said first output terminal during said reset phase;

first evaluating means, coupled to said first output terminal, for evaluating said at least one input signal for said first output terminal during said evaluation phase;

a second output terminal within said output second resetting means, coupled to said second output terminal, for resetting said second output terminal during said reset phase; and a second evaluating means, coupled to said second output terminal, for evaluating said at least one input signal for said second output terminal during said evaluation phase;

wherein said first resetting means and said first evaluating means are in inactive states during said storage phase, and said first output terminal sustains and provides said evaluated signal at said first output terminal during said storage phase;

wherein said second resetting means and said second evaluating means are in inactive states during said storage phase, and said second output terminal sustains and provides said evaluated signal at said second output terminal during said storage phase.

27. The apparatus as in claim 25, wherein said domino circuit is a CMOS circuit.

28. The apparatus as in claim 27, wherein said reset signal is a precharge signal.

29. The apparatus of claim 28, wherein said first evaluating means includes two transistor means, two control terminals of said two transistor means receiving first states of two dual-monotonic signals, and wherein said two transistor means are connected to said first output terminal in series; and wherein said second evaluating means includes two transistor means, two control terminals of said two transistor means receiving second states of said two dual-monotonic signals, and wherein said two transistor means are connected to said second output terminal in parallel.

30. The apparatus of claim 24, wherein said apparatus further comprises:

means for generating a final output signal in response to each of said plurality of functional outputs generated by said plurality of function blocks.

31. The apparatus of claim 30, wherein said apparatus further comprises:

means for generating a final completion signal in response to said final output signal.

32. The apparatus of claim 24, wherein each of said function blocks is a stage of a divider.

33. The apparatus of claim 32, wherein said divider stage comprises:

means for generating a partial remainder in response to a trailing partial remainder and a trailing quotient digit generated by a trailing function block, wherein said partial remainder generating means having an input for receiving said trailing partial remainder and having three inputs for receiving first, second and third possible values of said trailing quotient digit; and means for generating a quotient digit in response to said trailing partial remainder and said trailing quotient digit, wherein said quotient digit generating means having an input for receiving said trailing partial remainder and having three inputs for receiving said first, second and third possible values of said trailing quotient digit;

wherein said partial remainder and said quotient digit are respectively processed by said partial remainder generating means and quotient digit generating means in parallel.

34. The apparatus of claim 33, wherein said first, second, and third possible values of said trailing quotient digit are +1, −1, and 0 respectively.

35. The apparatus of claim 34, wherein said partial remainder and quotient digit are generated in accordance with SRT algorithm.

36. The apparatus of claim 35, wherein said quotient digit generating means comprises:

a first processing means for generating a first possible value of said quotient digit in response to said trailing partial remainder and said first possible value of said trailing quotient digit;

a second processing means for generating a second possible value of said quotient value in response to said trailing partial remainder and said second possible value of said trailing quotient digit;

wherein a third possible value of said quotient digit is said third possible value of said trailing quotient digit; and means for selecting said first, second and third possible values of said quotient digit in response to true value of said trailing quotient digit.

37. The apparatus of claim 36, wherein
said first processing means comprises a part-bit carry-save arithmetic adder; and
said second processing means comprises a part-bit carry-propagate arithmetic adder.

38. The apparatus of claims 24, wherein each of said function block performs one bit of an arithmetic operation for multiplication, division, square root, sine or cosine.

39. The apparatus of claim 24, wherein:
said functional output signal generated by each said pair-wise trailing function block is coupled only to said respective pair-wise leading function blocks;
wherein said completion signals generated by each said pair-wise leading function block is coupled only to said respective pair-wise trailing function block;
wherein connections to couple said output signals from said plurality of function blocks to each said respective leading function blocks form a critical path;
wherein connections to couple said completion signals from said plurality of control circuits to each said respective trailing function blocks form a plurality of control paths and;
wherein said plurality of control paths are parallel to said critical path, and none of said plurality of control paths overlap with said critical path
so that the overall combinatorial latency of said apparatus is only determined by the latencies of each of said function blocks located within said critical path and are not affected by said control circuits located within said control paths.

40. The apparatus of claim 39, wherein in case a control path overlaps with said critical path, such overlap is removed out of said critical path by making the function block causing said overlap more finely grained until zero overhead latency is achieved.

41. The apparatus of claim 39,
wherein an output of a most leading function block is coupled to an input of a most trailing function block; and
wherein completion signal generated by said most trailing function block is coupled to a reset terminal of said most leading function block so that connections among said plurality of function blocks form a ring structure.

42. The apparatus of claim 39, further comprising:
means for merging at least two functional output signals generated by at least two trailing function blocks to one input of a leading function block so that said at least two functional output signals are coupled to said leading function block; and
means for splitting a completion signal generated by said leading function block so that said completion signal is coupled to reset ports of said at least two trailing function blocks.

43. The apparatus of claim 39, further comprising:
means for splitting a functional output signal generated by a trailing function block so that said functional output signal is coupled to at least two inputs of two leading function blocks; and
means for combining completion signals generated by control means of said two leading function blocks; and
means for coupling combined completion signals to said reset port of said trailing function block.

44. The apparatus of claim 24,
wherein each of said function blocks includes a signal path for receiving and passing an input signal, and for generating and providing said output signal, said plurality of function blocks including a plurality of signal paths; wherein at least one of said signal paths has higher usage probability; and
wherein devices, including transistors, located in said at least one signal path having higher usage probability have wider conduct paths, thereby increasing speed of said signal path.

45. The apparatus of claim 24,
wherein each of said function blocks includes a signal path for receiving and passing an input signal, and for generating and providing said output signal, said plurality of function blocks including a plurality of signal paths;
wherein at least one of said plurality of signal paths has higher usage probability than other of said plurality of signal paths;
wherein devices, including transistors, located in said at least one signal path having higher usage probability are simplified to shorten logic blocks, thereby by increasing speed of said signal path; and
wherein devices in at least one of said other signal paths are modified to generate equivalence of said output signal.

46. The apparatus as in claim 24, wherein each said function block is a combinatorial logic circuit.

47. A multi-stage pipeline for computing a result from data, said pipeline comprising:
a plurality of precharged stages;
said precharged stages connected so as to form at least one sequential path from a first precharged stage that receives said data to a final stage that generates said result;
each said stage receiving at least one input and generating an output;
means for keeping data separated as data flows from said first stage to said final stage through said plurality of precharged stages, said means for keeping data separated operating exclusive of explicit latches.

48. A pipeline circuit for computing a result from at least one input, said result being different from said input, said circuit comprising:
a plurality of functional blocks;
each said functional block having a connection to at least one other of said functional blocks, all said connections being made without any intervening latches;
each said functional block generating a functional output from a functional input, at least one of said plurality of functional blocks generating a different type of functional output from said functional output generated by another one of said plurality of functional blocks;
each said functional block including means for storing the functional output that was generated by that same functional block;
said functional output storage occurring concurrent with said functional output generation.

49. An electronic circuit for computing a functional output from at least one functional input, said functional output being different from said functional input, said circuit comprising:
a plurality of function blocks, at least one of said plurality of functional blocks generating a different type of functional output from said functional output generated by another one of said plurality of functional blocks;

each said function blocks having means for receiving said at least one input and means for generating and storing said output;

each of said function blocks connected without an intervening storage latch;

means for controlling forward flow of data through said plurality of function blocks so that the cycle time of said electronic circuit is determined by the execution speed of said function blocks alone.

50. An electronic circuit for computing a functional output from at least one functional input, said circuit comprising:

a plurality of function blocks;

each said function blocks having means for receiving said at least one input and means for generating and storing said output;

each of said function blocks connected without an intervening storage latch; and means for controlling forward flow of data through said plurality of function blocks so that the cycle time of said electronic circuit is determined by the execution speed of said function blocks alone;

wherein said means for controlling includes control paths, and wherein said control paths operate in parallel with forward evaluation of said function blocks of said functional path and do not add sequentially to said functional path.

51. The circuit in claim 50, wherein the forward flow of data is controlled locally based on the status of data in the sending and receiving functional blocks, and not based on clock timing signals.

52. The circuit in claim 51, wherein known probabilistic distributions of the inputs of each functional block are used to size transistors in that functional block to minimize the expected value of the total delay in preference to minimizing the maximum delay.

* * * * *